United States Patent [19]
Burns et al.

[11] Patent Number: 5,738,757
[45] Date of Patent: Apr. 14, 1998

[54] PLANAR MASKING FOR MULTI-DEPTH SILICON ETCHING

[75] Inventors: Brent E. Burns, Rancho Palos Verdes; Benedict B. O'Brien, Manhattan Beach, both of Calif.

[73] Assignee: Northrop Grumman Corporation, Los Angeles, Calif.

[21] Appl. No.: 521,903

[22] Filed: Nov. 22, 1995

[51] Int. Cl.⁶ .................................................. C03C 15/00
[52] U.S. Cl. ...................... 156/644.1; 156/653.1; 156/657.1; 156/659.11; 156/661.11; 216/47; 430/312; 430/316; 430/394
[58] Field of Search ...................... 156/661.11, 644.1, 156/659.11, 653.1, 657.1; 216/47, 51; 430/312, 316, 313, 394, 396

[56] References Cited

U.S. PATENT DOCUMENTS

| | | | |
|---|---|---|---|
| 4,021,276 | 5/1977 | Cho et al. | 156/644 |
| 4,589,952 | 5/1986 | Behringer et al. | 156/628 |
| 4,863,560 | 9/1989 | Hawkins | 156/644 |
| 4,911,783 | 3/1990 | Voboril | 156/643 |
| 4,957,592 | 9/1990 | O'Neil | 156/644 |
| 4,981,552 | 1/1991 | Mikkor | 156/647 |
| 5,006,202 | 4/1991 | Hawkins et al. | 156/644 |
| 5,118,384 | 6/1992 | Harmon et al. | 156/643 |
| 5,154,797 | 10/1992 | Blomquist et al. | 156/644 |
| 5,201,987 | 4/1993 | Hawkins et al. | 156/633 |

*Primary Examiner*—R. Bruce Breneman
*Assistant Examiner*—Anita Alanko
*Attorney, Agent, or Firm*—Terry J. Anderson; Karl J. Hoch, Jr.

[57] ABSTRACT

A planar masking process for multi-depth etching of a silicon wafer wherein more than one etch depth is photo-lithographically patterned prior to etching the wafer and while the wafer still has a planar surface. A plurality of layers of masking material are disposed on at least one of the top and bottom surfaces of the silicon wafer and various of these layers are patterned by selectively photolithographically patterning and removing regions of the layers to form masks for areas where different silicon etch depths are desired. After forming the masks, the wafer is etched to a first level and the outermost mask is removed by etching. The silicon wafer is then again etched to another level with the remaining masks in place. The uppermost mask of the remaining masks is removed and the silicon wafer is again etched to still another level. The process is repeated until the desired levels have been etched in the silicon wafer.

18 Claims, 14 Drawing Sheets

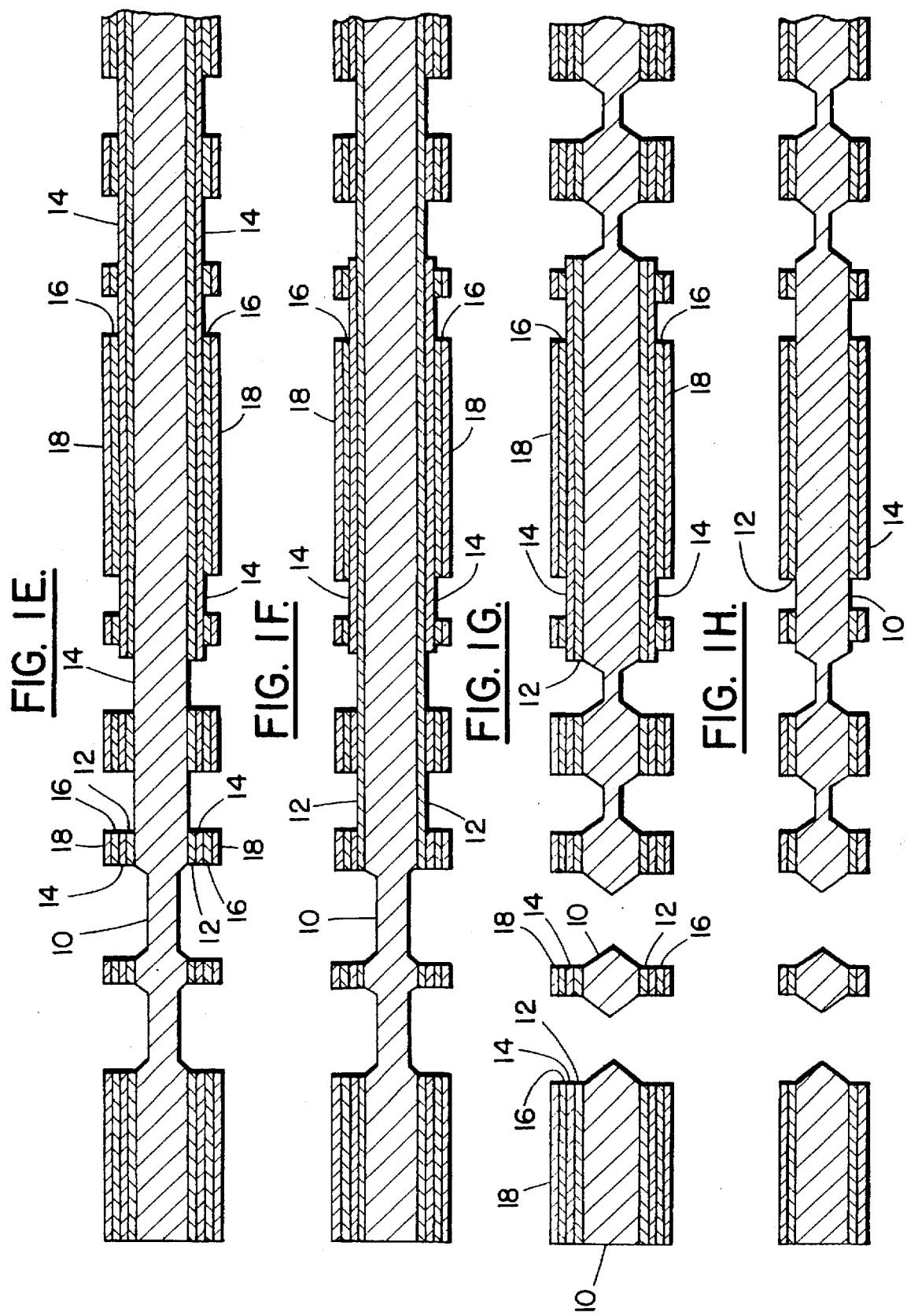

FIG. 7A.
FIG. 7B.
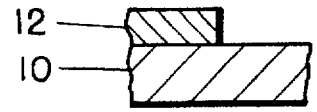
FIG. 7C.
FORM THIN OXIDE
FIG. 7D.
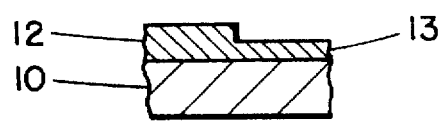
FIG. 7E.
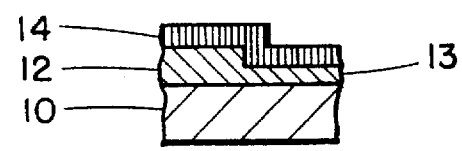
FIG. 7F.
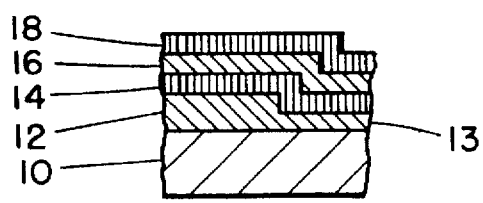
FIG. 7G.
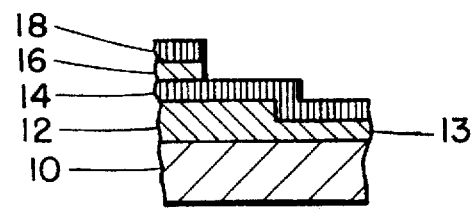
FIG. 7H.
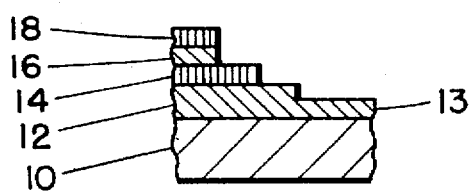
FIG. 7I.
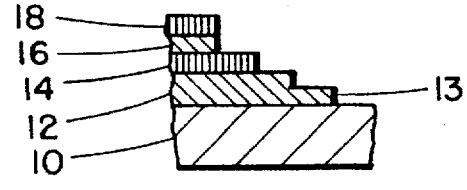
FIG. 7J.
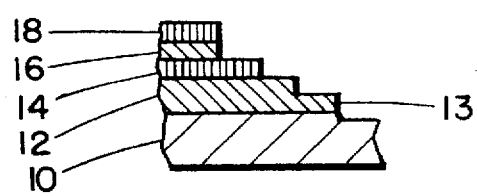
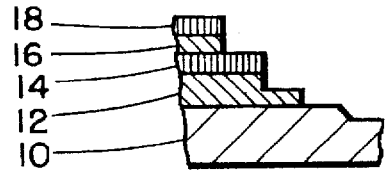

FIG. 8L.
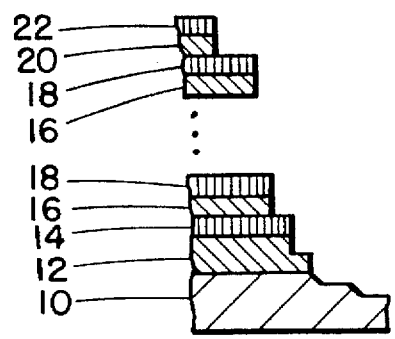
FIG. 8N.
FIG. 8M.
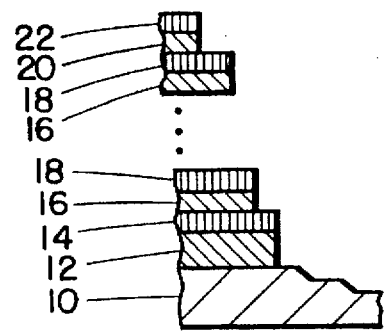
FIG. 8O.
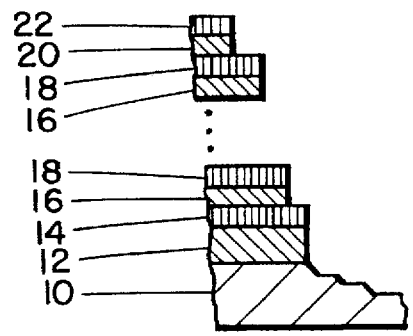
FIG. 8P.
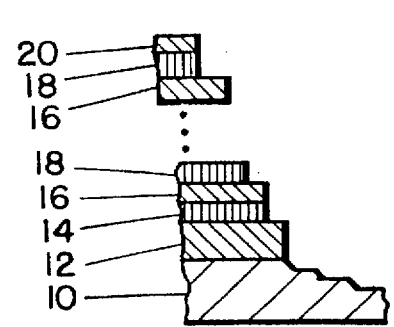
FIG. 8Q.
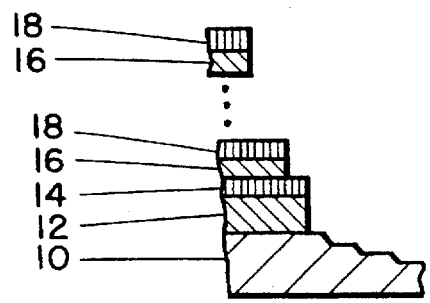
FIG. 8R.
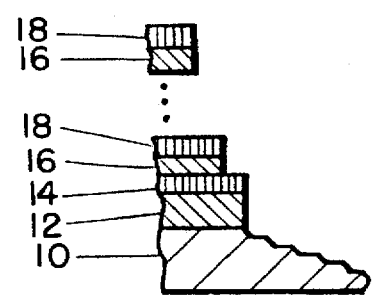
FIG. 8S.
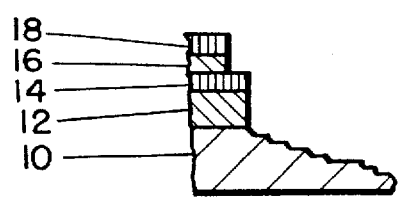
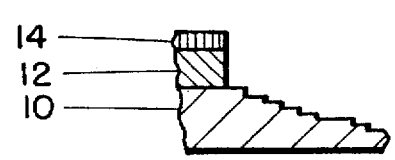

5,738,757

PLANAR MASKING FOR MULTI-DEPTH SILICON ETCHING

BACKGROUND OF THE INVENTION

1. Field of the Invention

The present invention relates to fabrication processes for silicon structures, and more particularly to a process for etching silicon structures to multiple depths.

2. Background Art

U.S. Pat. No. 5,154,797 issued Oct. 13, 1992 to Blomquist et al. entitled "Silicon Shadow Mask" discloses a process wherein a shadow mask for sputtering is formed from a single crystal silicon wafer which is mechanically and chemically polished to produce top and bottom surfaces which are substantially flat and parallel to one another. The wafer is provided with one or more pyramidal etch pits which are arranged in a pattern. Each pit has a substantially square cross-section on the top surface, and a smaller substantially square cross-section on the bottom surface to produce an aperture in the wafer. In use, the wafer is clamped against a flat substrate with its apertures opening toward the evaporant beam. After use, the deposited species may be cleaned from the wafer using suitable etchants which render the wafer unharmed, and therefore reusable.

In this reference the silicon dioxide and silicon nitride layers are used as masking material for etching a single pattern and depth into the wafer surface. The patterning and etching is done on only one side of the wafer in the process.

U.S. Pat. No. 5,118,384 issued Jun. 2, 1992, to Harmen et al. entitled "Reactive Ion Etching Buffer Mask" discloses an improved mask and method of forming a deep and uniform width trench in a substrate and the resulting structure. A substrate material such as silicon has deposited thereon a first layer of sacrificial material as a first component of an etch mask, the sacrificial material being a material such as polysilicon that is either etched by or absorbs the same ions which reactively ion etch the substrate. A second layer of material which resists reactive ion etching, such as silicon dioxide, is deposited over the first layer of material as a second component of the etch mask. The silicon dioxide is patterned in the form of the trench to be formed in the substrate. The layer polysilicon material is then reactive ion etched and the reactive ion etching continued to form a trench in the silicon substrate. The polysilicon acts as a sacrificial material being etched by any ions that are reflected from the silicon dioxide or are directed at an angle such that they strike the layer of polysilicon material. Thus, only those ions which are directed essentially normal to the underlying substrate perform the trench etching. This allows the trench to have essentially straight side walls and to be of essentially uniform width.

This patent describes a process for etching trenches in silicon. Several masking layers are necessary to provide a sacrificial layer to absorb non-vertical impending ions during RIE etching. The process describes a means for etching a single pattern to a given depth on only one side of a wafer.

U.S. Pat. No. 4,981,552 issued Jan. 1, 1991 to Mikkor entitled "Method For Fabricating A Silicon Accelerometer Responsive To Three Orthogonal Force Components" describes an accelerometer fabricated from silicon which is responsive to the three orthogonal components of an applied force. A method is also disclosed for etching the accelerometer from a single silicon substrate. Three rectangular beams or cantilevers are formed each having vertical sidewalls lying in crystalline planes orthogonal to one another. Each of the beams is directly responsive to one of the three orthogonal force components. This patent describes a process for etching only one depth per side of the wafer. Also, the process includes patterning on only one side of the wafer at a time.

U.S. Pat. No. 4,957,592 issued Sep. 18, 1990 to O'Neill entitled "Method Of Using Erodable Masks To Produce Partially Etched Structures In ODE Wafer Structures" describes a process wherein thermal ink jet silicon wafer printhead is formed in a single etching operation by partially etching into one portion of the wafer while at the same time completely etching through another portion of the wafer. An erodable mask layer is used to delay etching of partially etched regions into the wafer, the depth of the etching being defined by the etch time after the removal of the erodable masking layer, or by the V-groove termination as determined by via opening. This process involves application and patterning of masking layers sequentially rather than the application of all layers before the patterning process is begun.

U.S. Pat. No. 4,863,560 issued Sep. 5, 1989 to Hawkins entitled "Fabrication Of Silicon Structures By Single Side, Multiple Step Etching Process" discloses a process wherein three dimensional silicon structures are fabricated from (100) silicon wafers by a single side, multiple step ODE etching process. All etching masks are formed one on top of the other prior to the initiation of etching, with the coarsest mask formed last and used first. Once the coarse anisotropic etching is completed, the coarse mask is removed and the finer anisotropic etching is done. The preferred embodiment is described using a thermal ink jet channel plate as the three dimensional structure, where coarse etching step provides the reservoir and the fine etching step provides the ink channels. This patent describes the technique for patterning on only one side of a wafer rather than a double sided patterning process. Each of the Hawkins' masking layers in the reference is patterned after the layer is deposited/grown and before the next masking layer is deposited. The reference only describes a single thickness of oxide and does not provide a detailed description of a means for patterning more than two (oxide and nitride) masking layers.

U.S. Pat. No. 4,589,952 issued May 20, 1986 to Behringer et al. entitled "Method Of Making Trenches With Substantially Vertical Sidewalls In Silicon Through Reactive Ion Etching" describes a method of making trenches having substantially vertical sidewalls in a silicon substrate using a three level mask comprising a thick photoresist layer. Openings are formed in the thin photoresist layer and silicon nitride layer by reactive ion etching in $CF_4$. The openings are continued through the thick photoresist by etching in an atmosphere containing oxygen. The exposed surface of the silicon substrate is then etched in a $CF_4$ atmosphere containing a low concentration of fluorine. Also disclosed is a method of making an electron beam transmission mask wherein the openings are made using the three level mask and reactive ion etching of silicon using the etching technique of the invention. This patent describes multiple layers of masking materials which are used to transfer a pattern onto a silicon substrate. The thick layer of resist is necessary to produce vertical side walls in trenches etched into the silicon surface. The thin nitride and photoresist are used to maintain mask dimensions while transferring a pattern into the thick photoresist. In the process of the references each side of the wafer is etched separately and only one etch depth is produced on each side of the wafer.

U.S. Pat. 4,021,276 issued May 3, 1977 to Cho et al. entitled "Method Of Making Rib-Structure Shadow Mask For Ion Implantation" discloses a shadow mask particularly useful in ion implantation processes. The mask is fabricated by doping a surface region of a semiconductor wafer to render that region resistant to a particular etchant, machining cavities in the surface of the wafer opposite the doped surface to a depth that does not quite reach the doped region, forming pattern openings in the webs remaining across the ends of the cavities, and thinning the webs by exposure to the particular etchant until the undoped material in the webs is removed. Thus, the ultimate thickness of the webs is controlled substantially by the doping depth. In this patent, the multiple masking layers (silicon nitride and silicon dioxide) are used for defining only a single pattern on one side of the silicon wafer rather than multiple patterns on both sides of the silicon wafer.

SUMMARY OF THE INVENTION

An object of the present invention is to provide a multi-depth etching process of silicon structures which permits patterning for more than one depth etch prior to etching the silicon structure and while the silicon structure still has a planar surface.

Another object of the present invention is to provide a multi-depth etching process which employs multi-etch steps on both sides of a silicon structure.

Still another object of the present invention is to provide a multi-depth etching process for silicon structures wherein a bottom oxide on said structure can be of multiple thicknesses to permit extra etch depths.

Another object of the present invention is to provide a multi-depth etching process for silicon structures wherein subsequent etch depths of the structure are started at predetermined times.

These and other aspects of the invention will be apparent from the accompanying drawings and the detailed description.

BRIEF DESCRIPTION OF THE DRAWINGS

FIGS. 1A through 1J are cross-sectional illustrations of a silicon structure during steps in a multi-depth etching process according to the principles of a first embodiment of the present invention.

DETAILED DESCRIPTION OF A PREFERRED EMBODIMENT

Figure 1A:
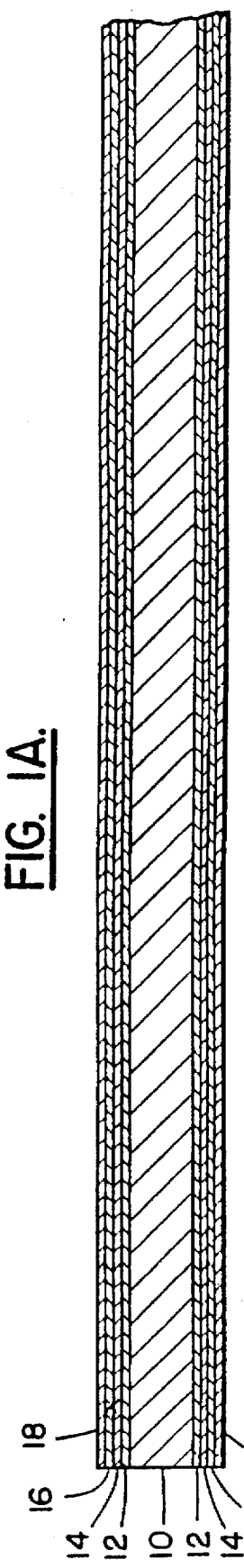

There is a wide application for sensors and actuators having elements such as diaphragms, beams, cantilevers and the like fabricated from silicon wafers by silicon micromachining processes. As illustrated by the references in the Background Art herein, the micromachining process involves the deposition of a masking layer such as silicon dioxide and/or silicon nitride onto a silicon wafer and then photolithographically patterning the masking layers to expose selected regions of the silicon wafer surface. The silicon wafer is then etched in the exposed regions to a selected depth by etching solutions or reactive ion plasmas.

For many silicon structures it is often desirable to have several different depths of etching on the same wafer. A typical structure may, for example, require a 3 micrometer etch, a 15 micrometer etch, a 130 micrometer etch and a 200 micrometer etch. Heretofore the various depths were obtained by performing the patterning and etching sequentially for each of the depths. That is, a first masking layer was put on the silicon layer and then patterned and etched down to the first etch depth of 3 micrometers.

The process of masking, patterning, etching, and stripping were then repeated on the etched structure for each subsequent etch depth of 15, 130, and 200 micrometers.

The photolithographic technique used to pattern the masking layer in the aforesaid fabrication process involves the application of a photoresist layer to the wafer. This photoresist layer is then patterned photolithographically and acts as a masking layer during the etching of the silicon dioxide and/or silicon nitride on the wafer surface.

The industry standard method for applying the photoresist is to put several drops of the photoresist on the wafer surface and spin the wafer on a vacuum chuck to spread resist into a uniform coating. When the wafer has had prior silicon etching, the edges of the etched structures form very sharp corners with the surface of the wafer. When photoresist is spun on a previously etched wafer according to prior techniques the resist layer does not spread out evenly and tends to pull away from and expose the top corners of the previously etched structures. The silicon dioxide and/or silicon nitride masking layer will then erroneously be removed from all these exposed edges causing a flaw in the silicon etch pattern.

Other methods of photoresist application such as dipping and spraying have been employed to improve uniformity but the edge coverage is still not complete. Improved edge coverage has been accomplished by making several layers of photoresist but this requires repeating the entire photolithography process several times for each wafer without stripping photoresist in between. In some cases it is necessary to hand-paint edges to protect them. This is a very time-consuming, inefficient, hands-on procedure which accounts for a very significant portion of the total wafer fabrication time.

The present invention provides a planar masking process for multi-depth/silicon etching that permits patterning for a plurality of etch depths before etching while the wafer still has a planar surface. This process eliminates any photolithography steps once the silicon structure etching has begun. The process involves the application of several alternating masking layers (e.g. silicon dioxide and silicon nitride) on a planar silicon wafer. The number of alternating masking layers employed depends on the number of different levels of etch depths required. Various layers of the masking material are removed in regions where different etch depths in the silicon wafer are required. After patterning the masking layers, the wafer is exposed to a silicon etchant such as potassium hydroxide (KOH). After the first silicon etching the wafer is then exposed to an etchant which selectively etches one of the masking layers. For example, a buffer oxide etchant solution will etch silicon dioxide approximately 80 times faster than it etches silicon nitride. Likewise, reactive ion etching (RIE) etching with nitrogen trifluoride will etch silicon nitride much faster than silicon dioxide (also phosphoric acid can be used to strip silicon nitride without adversely affecting silicon or silicon dioxide). After the selective masking layer etch, the wafer is then again exposed to a silicon etchant. The process is then repeated depending on how many different etch depths are required.

Referring to the drawing, FIGS. 1A through 1J illustrate steps of an embodiment of a process according to the present invention for achieving three etch depths on a silicon wafer.

In FIG. 1A, a layer of silicon dioxide 12 is grown on a planar silicon wafer 10, after which the three layers 14, 16 and 18 are deposited, such as by low pressure chemical vapor depositions (LPCVD). Layer 14 is silicon nitride, layer 16 is silicon dioxide and layer 18 is another layer of silicon nitride. Thus, four layers of alternating masking material are provided for the desired three etch depths.

Figure 1B:
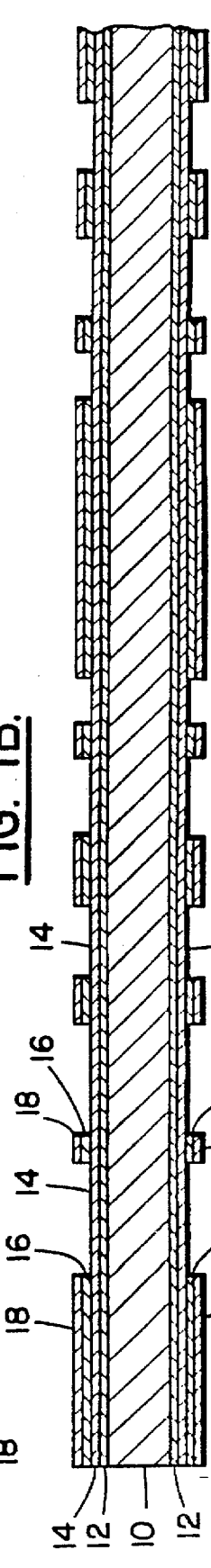

In FIG. 1B the silicon nitride layer 18 is photolithographically patterned for the combined etching areas of all three desired etch depths and the exposed portions of silicon nitride layer 18 and underlying portions of silicon dioxide layer 16 are etched in turn in nitride and oxide etchants to provide the structure illustrated in the cross-sectional view of FIG. 1B.

Figure 1C:
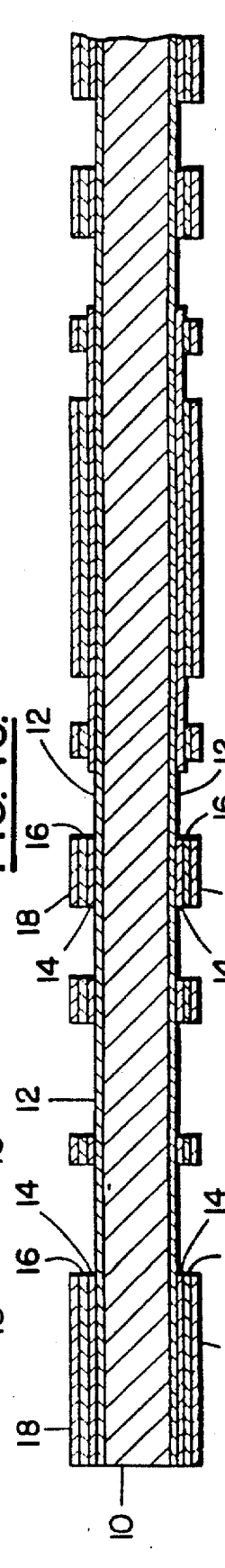

In FIG. 1C a second photolithography step patterns the silicon nitride layer 14 for the combined etching areas of only the second and third deeper etch depths, and the exposed portions of silicon nitride layer 14 are removed by using a nitride etchant to produce the structure illustrated in the cross-section view of FIG. 1C.

Figure 1D:
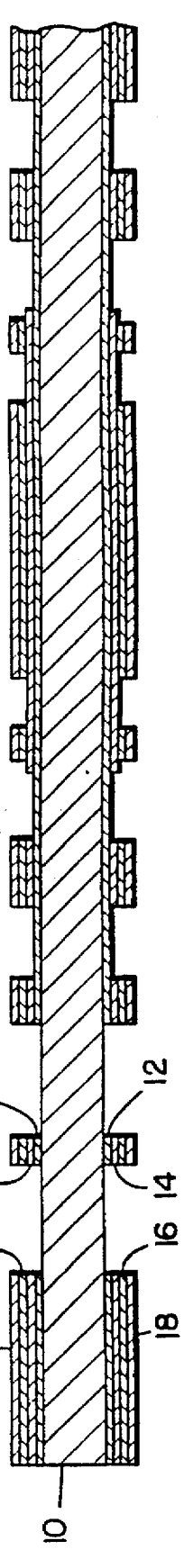

In FIG. 1D a final photolithography patterning step patterns the silicon dioxide layer 12 for the etching areas of only the third, or deepest, etch depth and an oxide etchant is used to remove the exposed areas of silicon dioxide layer 12, leaving areas of the surface of the silicon wafer exposed.

At this point, a composite mask has been formed for all three desired etch level depths composed of the remaining portions of layers 12, 14, 16, and 18 prior to any etching of the planar silicon wafer 10.

Next, the exposed areas of the silicon wafer 10 are etched to an initial depth equal to the difference between the third, or deepest, etch depth and the second etch depth to produce the cross-section configuration in FIG. 1E. A buffer oxide etchant is then employed to remove the exposed silicon dioxide mask layer 12 of FIG. 1E that is not protected by the bottom silicon nitride mask layer 14 to provide the structure shown in cross-section in FIG. 1F.

A second etching step of the silicon wafer 10 using an etch solution, such as KOH, then removes an additional depth of silicon equal to the difference between the second etch depth and the first etch depth from all exposed areas to result in the structure cross-section of FIG. 1G. A RIE etch is then carried out to remove the top silicon nitride mask layer 18 and the areas of silicon nitride layers 14 which are not protected by the silicon dioxide layer 16. Then a buffered oxide etchant solution is employed to remove the silicon dioxide layer 16 and the portions of the silicon dioxide layer 12 which were exposed by the RIE step. The result is the structure cross-section as illustrated in FIG. 1H.

Figures 1I, 1J:
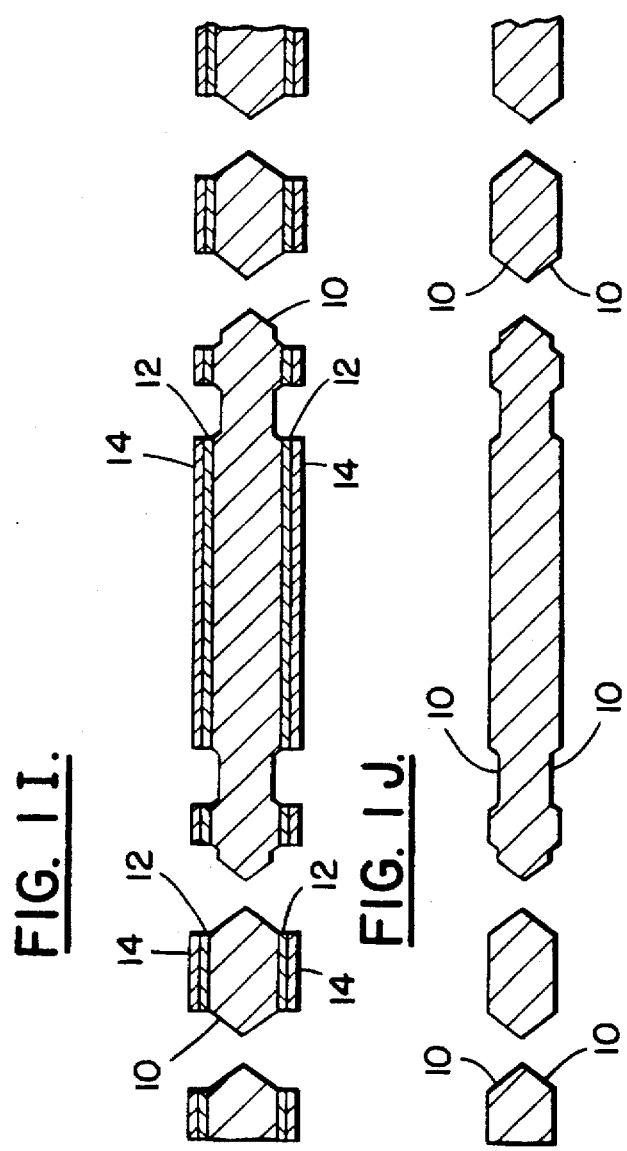

A final etch, such as with KOH etchant solution, is carried out to remove a final depth of silicon equal to the first etch depth from all the exposed areas of the silicon wafer 10 to result in the cross-section shown in FIG. 1I.

When the remaining portions of layers 12 and 14 are stripped, the result is a wafer as shown in cross-section in FIG. 1J with three different etch-depth areas obtained without having to perform any photolithography steps on an etched surface. Additional etch depths can be fabricated, limited only by the added number of alternating masking layers it is practical to deposit.

In the described embodiment, four mask layers (two pairs) were used to fabricate a structure having three etch depth levels. In the general case the relationship between the number of desired etch depth levels and the number of pairs of mask layers is that N levels requires N−1 pairs of mask layers for N greater than or equal to 2 when the bottom oxide layer is of single thickness. Thus, to fabricate a structure with 6 etch depth levels, 6−1=5 pairs of mask layers=10 mask layers are required.

In the described embodiment, the silicon nitride layer 18 and the silicon dioxide layer 16 were employed as a pair to form one mask, and were patterned and etched together to form the mask illustrated in FIG. 1B. The bottom two layers, silicon dioxide layer 12 and silicon nitride layer 14 were processed separately to form two separate masks as shown in FIG. 1D. In the general case, with the exception of the first and second layers on the substrate, all further layers are used in pairs (i.e., a layer of oxide and a layer of nitride) with each of such pairs constituting a single mask. The first and second layers on the substrate form first and second masks and such first and second single layers are exceptions for the following reason.

The multi-depth silicon etch process described produces a stepped mask pattern on the silicon wafer 10, each step corresponding to the edge of a photolithographically produced pattern as shown in FIGS. 1A through 1J. After each silicon etch, the step structure is transferred downward toward the silicon surface until the bottom (nearest the surface of silicon layer 10) step is just removed. Then the next silicon etch step is performed and the process repeated.

The foregoing first embodiment of the invention is shown in alternative detail in FIGS. 2a through 2g, 3a through 3k, and 4a through 4q for forming silicon substrate structures having two, three, and more than three separate levels of etch depth.

Figure 2A:
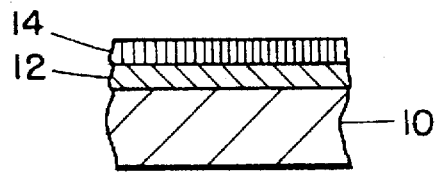
FIGS. 2a through 2g are cross-sectional illustrations of the first embodiment of the invention which forms a silicon substrate structure having only two separate levels of etch depth.
Figure 2B:
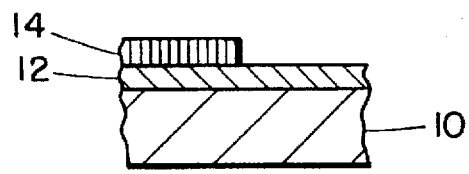
Figure 2C:
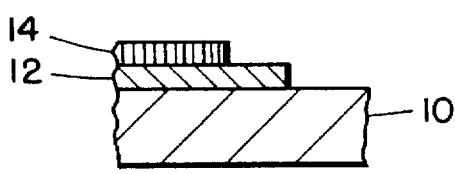
Figure 2D:
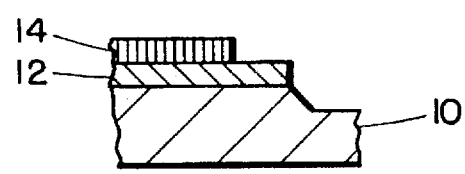
Figure 2E:
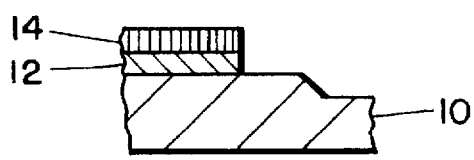
Figure 2F:
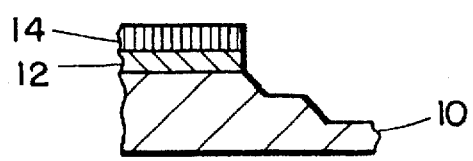
Figure 2G:
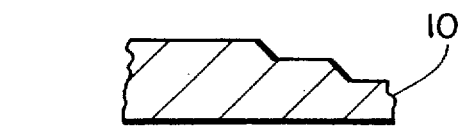

In FIGS. 2a through 2g, the first embodiment of the invention is employed to fabricate a silicon substrate structure having only two separate levels of etch depth. In such cases, only one pair of layers of masking material are formed on the silicon wafer 10, those layers being a silicon dioxide layer 12 and a silicon nitride layer 14 in FIG. 2a. The silicon nitride layer 14 and silicon dioxide layer 12 are sequentially patterned to form, respectively, a first mask encompassing the combined etching areas of the first and second separate levels of etch depth (FIG. 2b) and a second mask encompassing all the separate levels of etch depth other than the first separate level of etch depth (FIG. 2c). In this case, the second mask encompasses only the second separate level of etch depth. The silicon wafer 10 is then etched (FIG. 2d), exposed portions of the second mask which do not underlie the first mask are removed (FIG. 2e), and a second and final etching of silicon wafer 10 is performed (FIG. 2f). Lastly, the remaining portions of the first and second masks are removed to produce the silicon substrate structure (FIG. 2g).

Figure 3A:
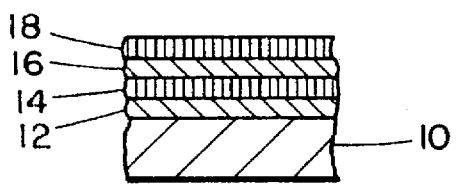
FIGS. 3a through 3k are cross-sectional illustrations of the first embodiment of the invention which forms a silicon substrate structure having three separate levels of etch depth.
Figure 3B:
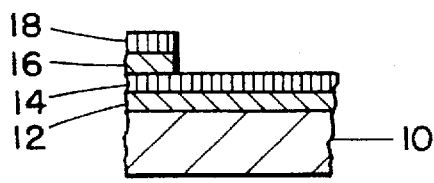
Figure 3C:
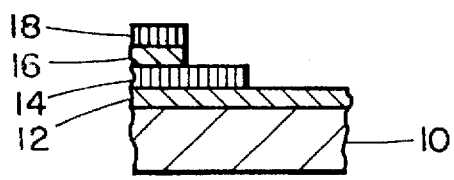
Figure 3D:
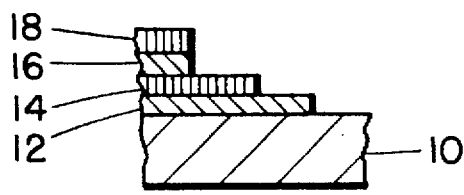
Figure 3E:
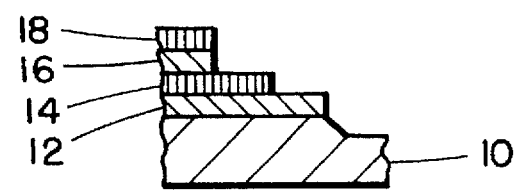
Figure 3F:
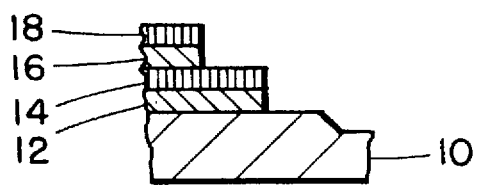
Figure 3G:
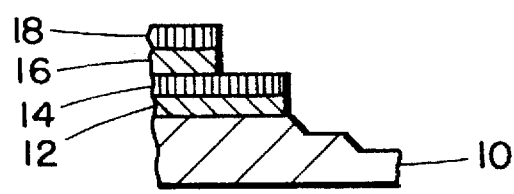

FIGS. 3a through 3k illustrate the embodiment of the invention earlier described, i.e., wherein there are three separate levels of etch depth, but for a substrate structure 10 corresponding to that of FIGS. 2a through 2g. As in the earlier description, four layers of masking material are formed on silicon wafer 10 (FIG. 3a). Those layers comprise, as before, alternating layers of silicon dioxide and silicon nitride 12, 14, 16, and 18.

The uppermost pair of these alternating layers 16, 18 is patterned to form the first mask (FIG. 3b) encompassing all three separate levels of etch depth. Silicon nitride layer 14 is patterned to form a second mask (FIG. 3c) encompassing only the second and third separate levels of etch depth (that is, all levels other than the first separate level), and silicon dioxide layer 12 is patterned to form a third mask (FIG. 3d) encompassing only the deepest, or third, separate level of etch depth.

A first etching of silicon wafer 10 is performed through all three masks (FIG. 3e), after which exposed portions of silicon dioxide layer 12 which do not underlie silicon nitride layer 14 are removed (FIG. 3f) and a second etching of silicon wafer 10 is performed (FIG. 3g) through the first and second masks and remaining portions of the third mask.

Figure 3H:
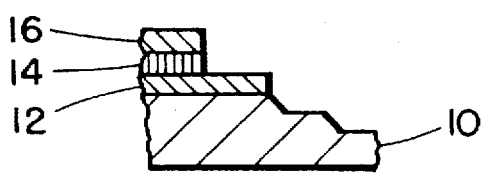

Exposed portions of silicon nitride layers 18 and 14 which do not underlie a protective silicon dioxide layer are then removed (FIG. 3h). This step thus removes the upper silicon nitride layer 18 of the first mask and those exposed portions of the silicon nitride layer 14 of the second mask which are not covered by the silicon dioxide layer 16 of the first mask.

Figure 3I:
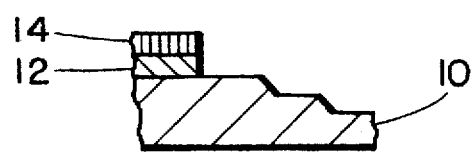
Figure 3J:
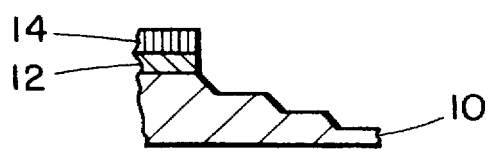

Next, exposed portions of silicon dioxide layers 16 and 12 which do not underlie a protective silicon nitride layer are removed (FIG. 3i). This step removes the remaining silicon dioxide layer 16 of the first mask and those exposed portions of the silicon dioxide layer 12 which do not underlie the remaining portion of silicon nitride layer 14 of the second mask.

Figure 3K:

A third, and final etching of silicon wafer 10 is performed (FIG. 3j) through the remaining portions of silicon nitride layer 14 and silicon dioxide layer 12, i.e. the remaining portions of the second and third masks. Thereafter, those remaining portions of the second and third masks are removed to provide the silicon substrate structure 10 having three separate levels of etch depths (FIG. 3k).

FIGS. 4a through 4i illustrate the general case of the first embodiment of the invention where the silicon substrate structures has N separate levels of etch depth, N being an integer greater than three.

Figure 4A:
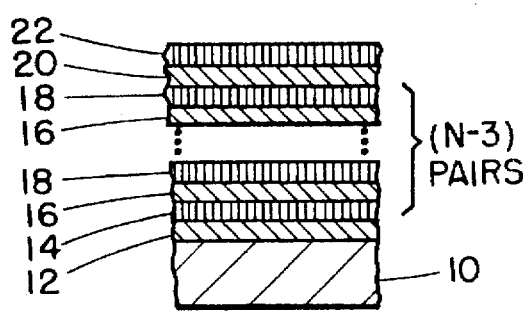
FIGS. 4a through 4q are cross-sectional illustrations of the first embodiment of the invention which forms a silicon substrate structure having more than three separate levels of etch depth.
Figure 4B:
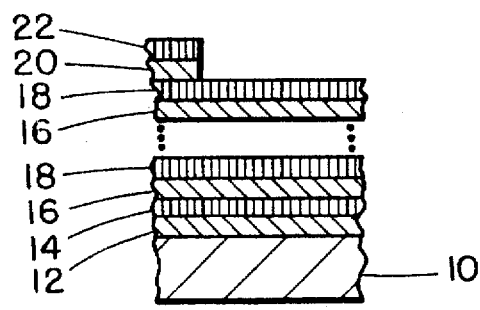
Figure 4C:
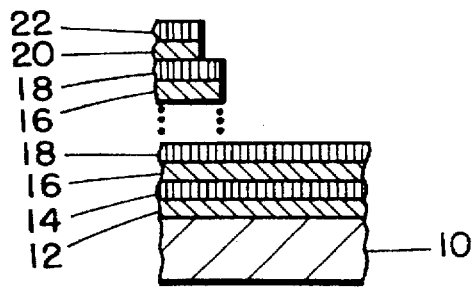
Figure 4D:
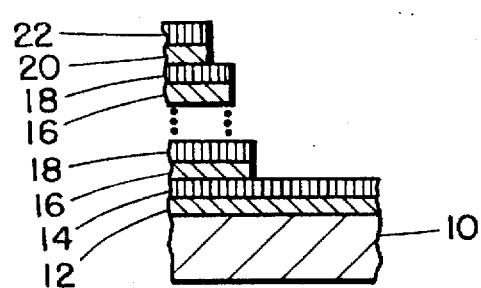
Figure 4E:
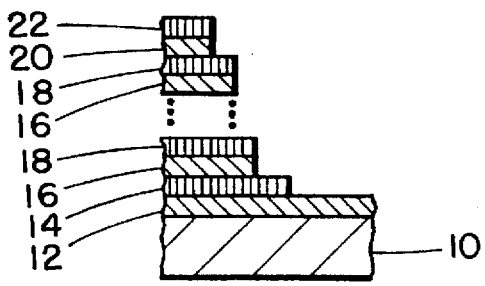
Figure 4F:
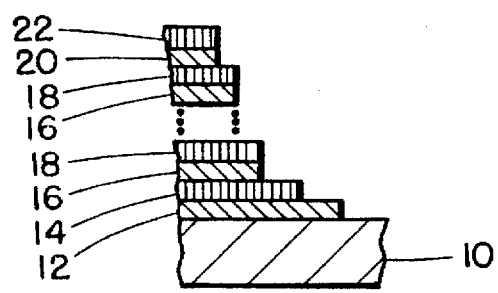
Figure 4G:
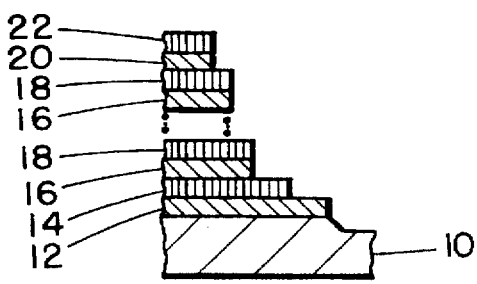
Figure 4H:
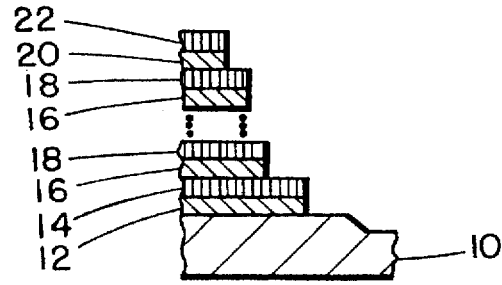
Figure 4I:
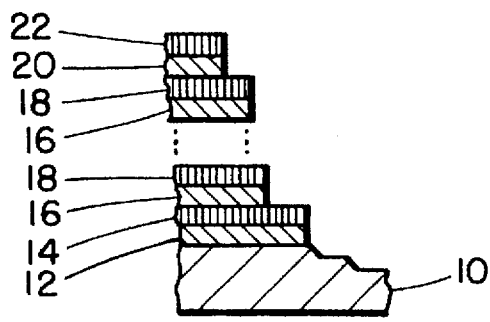
Figure 4J:
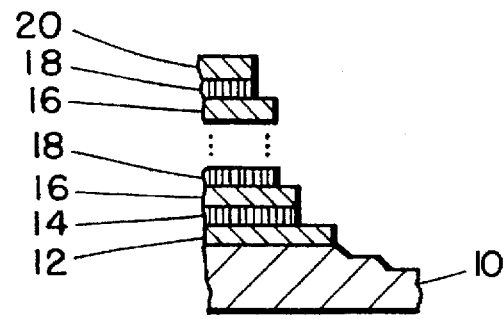
Figure 4K:
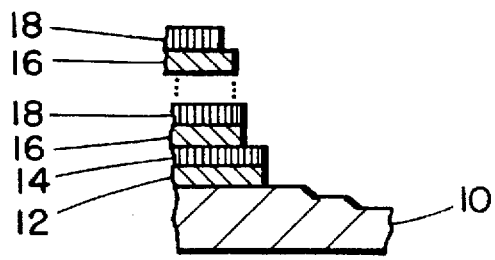
Figure 4L:
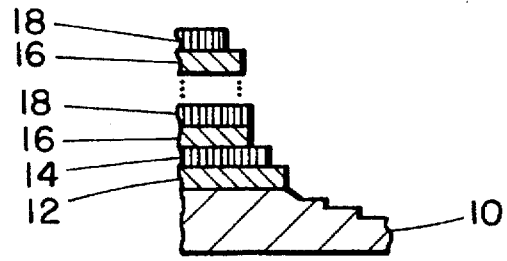
Figure 4M:
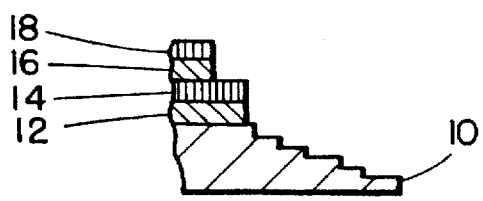
Figure 4N:
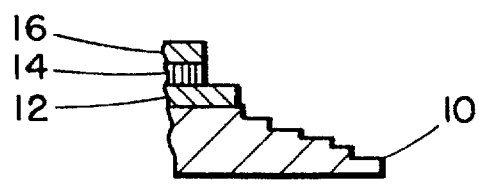
Figure 4O:
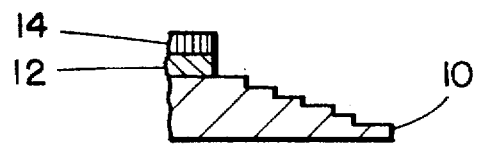
Figure 4P:
Figure 4Q:

Referring to FIG. 4a, 2×(N−1) layers of masking material are formed on silicon wafer 10. These alternating layers comprise a silicon dioxide layer 12 formed on the silicon wafer 10, a silicon nitride layer 14 formed on the silicon dioxide layer 12, (N−3) intermediate pairs of alternating layers 16, 18 of silicon dioxide and silicon nitride, and an uppermost pair of such alternating layers 20, 22.

After the 2×(N−1) layers of masking material are formed on silicon wafer 10, the uppermost pair of alternating layers is photolithographically patterned (FIG. 4b) to form a first mask encompassing the combined etching areas of all N separate levels of etch depth.

Next, the upper pair of the (N−3) intermediate pairs of alternating layers is photolithographically patterned (FIG. 4c) to form a second mask encompassing combined etching areas of all N separate levels of etch depth other than the first separate level of etch depth. Lower pairs of the (N−3) intermediate pairs of alternating layers are successively patterned (FIGS. 4d) to encompass combined etching areas of all separate levels of etch depth other than levels from the first separate level through the next separate level of etch depth to the level last excluded by the previous patterning step.

That is to say, the step of photolithographically patterning the intermediate pairs of alternating layers is repeated (N−4) times for each integer K, K=1, 2, ..., (N−4) to successively pattern lower intermediate pairs of alternating layers to form (N−4) additional masks. Each additional mask successively encompasses all N separate levels of etch depths other than the levels of etch depth from the first separate level through separate level (1+K). It is to be understood that, where N is equal to 4, only the upper pair of the (N−3) intermediate pairs is formed and patterned.

After all the intermediate pairs of alternating layers are patterned, the silicon nitride layer 14 is photolithographically patterned to form a penultimate mask (FIG. 4e) which encompasses the combined etching areas of only the last two separate levels of etch depths, i.e. separate level (N−1) and separate level N or, in other words, all separate levels other than separate levels from the first separate level through separate level (N−2).

Thereafter, silicon dioxide layer 12 is photolithographically patterned to form a final mask (FIG. 4f) encompassing only the etching areas of separate level N of etch depth or, in other words, all separate levels other than level one through level (N−1).

After all the masks are formed, a first etching of silicon wafer 10 is performed (FIG. 4g) through them. Exposed portions of the final mask of silicon dioxide layer 12 which are not covered by the silicon nitride layer 14 are then removed (FIG. 4h), and a second etching of silicon wafer 10 is performed (FIG. 4i) through the remaining portions of all masks.

Thereafter, as illustrated in (FIGS. 4j through 4p), exposed portions of each remaining layer of nitride material 22, 18, 14 which do not underly a remaining protective layer of oxide material 20, 16 are removed, and then exposed portions of each remaining layer of oxide material 20, 16, 12 which do not underly a remaining protective layer of nitride material 18, 14 are removed, and a next etching of silicon substrate 10 is performed through the remaining portions of all remaining masks, i.e. the remaining portions of the remaining layers of oxide material and nitride material.

The above steps are repeated (N−4) times to remove all masks other than the lowermost mask of the (N−4) additional masks. A penultimate etching of silicon substrate 10 is then performed through the remaining portions of the lowermost additional mask, the penultimate mask, and the final mask.

Thereafter, the exposed portions of the remaining nitride layers 18, 14 which do not underly a protective remaining oxide layer 16 are removed, followed by the removal of the exposed portions of the remaining oxide layers 16, 12 which do not underly a protective remaining nitride layer 14. A final etch of silicon substrate 10 is performed through the last remaining portions of the penultimate and final masks, and those last remaining mask portions are then removed to provide the silicon substrate structure shown in FIG. 4q.

It is possible that such steps could also be produced in a single masking material (i.e. no layers) by very careful timing of the etches during patterning of the masking material. Then after each silicon etch the masking material etch would have to be very carefully timed to translate the step pattern downward. However, using one material would be very difficult due to possible variations in the etch rate of the masking material during both etching of the mask material and etching of the silicon.

Using different layers (i.e. pairs) of masking material according to the principles of the present invention eliminates the stringent timing requirements when producing the stepped structure and when translating the structure toward the silicon surface. The selectivity of the etches for the different mask layers causes the mask etch to terminate after the bottom step is removed and the upper layer-pair patterns are transferred down one layer-pair.

In the foregoing embodiment, the bottom layer-pair is split into two masks. Splitting the pair is possible because the pattern in the silicon nitride layer above the bottom oxide layer can be transferred to the bottom oxide layer using a buffered oxide etchant without disturbing the steps in the upper layers.

In another embodiment of the present invention, the patterning of the bottom silicon dioxide layer 12 is followed by forming a thin oxide growth layer on silicon wafer 10 before deposition of the upper masking layers. When the bottom thermal oxide layer 12 is to be etched with buffered oxide etchant solution, the areas with the additional thinner thermal oxide can be opened selectively by timing the buffered oxide etchant solution etch. After a silicon etch step the areas with the thicker bottom thermal oxide layer 12 can be opened with another buffered oxide etchant solution etch. This variation allows one additional etch depth using the same number of LPCVD layers as in the first described process.

This embodiment of the invention is illustrated in FIGS. 5a through 5h, 6a through 6l, 7a through 7q, and 8a through 8u.

Figure 5A:
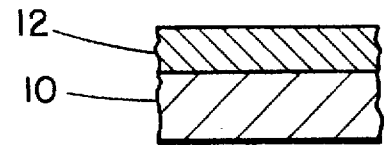
FIGS. 5a through 5h are cross-sectional views of a second embodiment of the invention which forms a silicon substrate structure having two separate levels of etch depth employing a thin oxide growth layer.
Figure 5B:
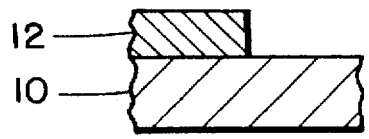
Figure 5C:
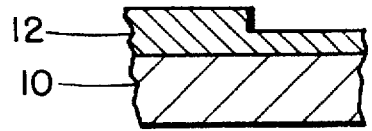
Figure 5D:
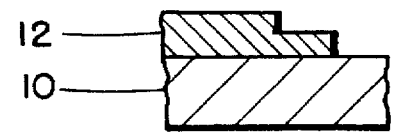
Figure 5E:
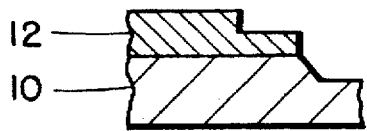
Figure 5F:
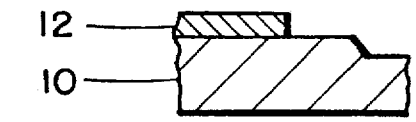
Figure 5G:
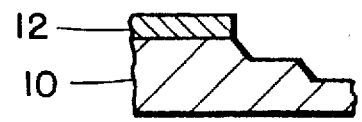
Figure 5H:

In the simplest case, shown in FIGS. 5a through 5h, a compound oxide layer formed on the silicon wafer 10 provides for two separate levels of etch depths. First, thick oxide layer 12 is formed on a surface of silicon wafer 10 (FIG. 5a). Thick oxide layer 12 is photo-lithographically patterned to form a penultimate mask encompassing combined etching areas of the first and second separate levels of etch depth (FIG. 5b). In general terms, the thick oxide layer 12 is patterned to form a penultimate mask encompassing the combined etching areas of the two deepest separate levels of etch depth (i.e., level (N–1) and level N).

Thin oxide layer 13 is then formed (FIG. 5c) on exposed surfaces of silicon wafer 10 which are not covered by the penultimate mask, and is photolithographically patterned (FIG. 5d) to form a final mask encompassing the etching areas only of the second, i.e. deepest, separate level of etch depth which is, in the general case, level N.

Thereafter, a first etching of the silicon wafer 10 is performed (FIG. 5e) through the penultimate and final masks, and a time-controlled etching is performed to remove the final mask (FIG. 5f) and upper portions of the penultimate mask. A final etching of silicon wafer 10 is performed (FIG. 5g) through the remaining portions of the penultimate mask and those remaining portions of the penultimate mask are then removed (FIG. 5h) to provide the silicon substrate structure. Two separate levels of etch depth have been provided without the need to deposit additional layers of nitride masking material.

It will thus be understood that the aforementioned embodiment can be employed to produce silicon substrate structures having a plurality of separate levels of etch depths.

For example, in FIGS. 6a through 6l, the second embodiment of the invention is employed to form a silicon substrate structure having three separate levels of etch depth. As before, the thick oxide layer 12 is formed and patterned on the silicon wafer 10 to form a penultimate mask encompassing the two deepest separate levels of etch depths, i.e. the second and third separate levels FIGS. 6a, 6b, and the thin oxide layer 13 is formed (FIG. 6c) on exposed surfaces of silicon wafer 10 not covered by the patterned thick oxide layer 12.

Figure 6A:
FIGS. 6a through 6l are cross-sectional views of the second embodiment of the invention which forms a silicon substrate structure having three separate levels of etch depth employing a thin oxide growth layer.
Figure 6B:
Figure 6C:
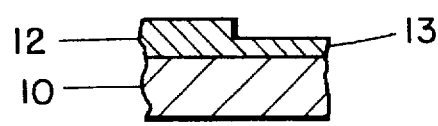
Figure 6D:
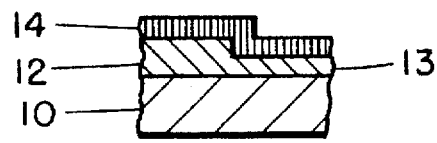
Figure 6E:
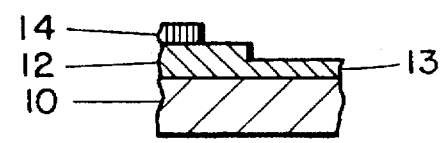
Figure 6F:
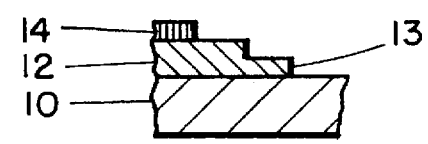
Figure 6G:
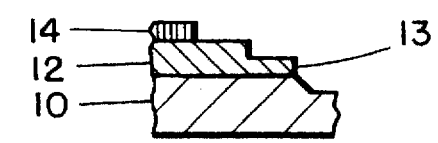

However, prior to patterning the thin oxide layer 13 to form the final mask, silicon nitride layer 14 is formed (FIG. 6d) over both thick oxide layer 12 and thin oxide layer 13. Silicon nitride layer 14 is then photolithographically patterned to form a first mask which encompasses the combined etching areas of all three separate levels of etch depths (FIG. 6e). Thereafter, thin oxide layer 13 is photolithographically patterned to form the final mask encompassing only the etching areas of the third, and deepest, separate level of etch depth (FIG. 6f).

Stated in general terms, the uppermost mask (in this case, patterned silicon nitride layer 14) is patterned to encompass combined etching areas of all separate levels of etch depths, while the penultimate mask (thick oxide layer 12) is photolithographically patterned to encompass all separate levels of etch depth other than the first separate level, and the final mask (thin oxide layer 13) is patterned to encompass only the etching areas of the deepest separate level of etch depth.

Figure 6H:
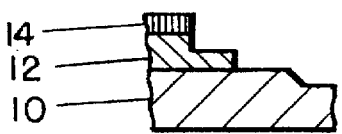
Figure 6I:
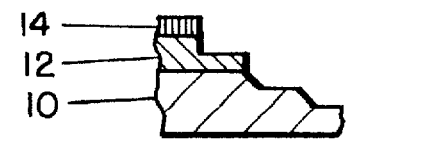
Figure 6J:
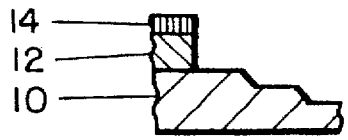
Figure 6K:
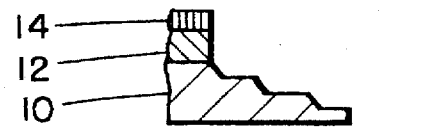
Figure 6L:
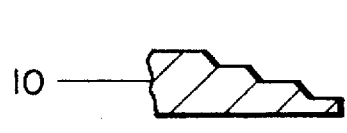

After the first, penultimate, and final masks are formed, a first etching (FIG. 6g) of silicon wafer 10 is performed. The final mask of thin oxide layer 13 is removed, as are the exposed upper portions of the penultimate mask of thick oxide layer 12 which are not covered by the first mask of silicon nitride layer 14, by a time-controlled etch (FIG. 6h).

A penultimate etching of silicon wafer 10 is then performed (FIG. 6i) through the first mask and the remaining portions of the penultimate mask. The exposed lower portions of the penultimate mask of thick oxide layer 12 which remain after the time-controlled etching are then removed (FIG. 6j), and a final etching of silicon wafer 10 is performed (FIG. 6k) through the remaining mask portions. Lastly, the remaining mask portions are removed to form the silicon substrate structure shown in FIG. 6l.

It will also be readily apparent that still additional levels of etch depth can be provided by forming additional pairs of alternating layers of silicon nitride and silicon dioxide on the silicon nitride layer 14 prior to photolithographically patterning that layer.

Figure 7K:
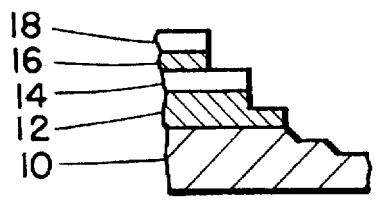
FIGS. 7a through 7q are cross-sectional views of the second embodiment of the invention which forms a silicon substrate structure having four separate levels of etch depth employing a thin oxide growth layer.
Figure 7L:
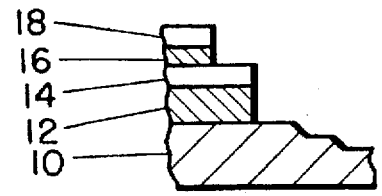
Figure 7M:
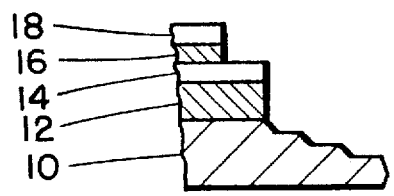
Figure 7N:
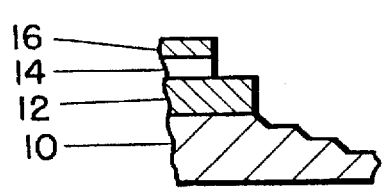
Figure 7O:
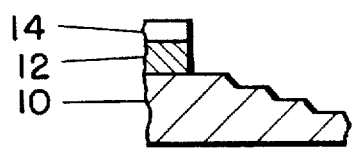
Figure 7P:
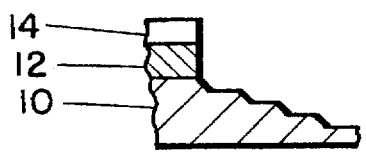
Figure 7Q:

FIGS. 7a through 7q of illustrate the second embodiment of the present invention where it is desired to provide four separate levels of etch depth to the silicon wafer 10.

As in the previous case, oxide layers 12 and 13 and nitride layer 14 are formed on silicon wafer 10 (FIGS. 7a, 7b, 7c and 7d). Prior to photolitho-graphically patterning silicon nitride layer 14, however, an upper pair of layers of masking material are formed on silicon nitride layer 14. This pair of layers comprises silicon dioxide layer 16 formed on silicon nitride layer 14, and silicon nitride layer 18 formed on silicon dioxide layer 16 (FIG. 7e).

The upper pair of layers 18, 16 is then patterned to form a first mask encompassing all four separate levels of etch depth. Silicon nitride layer 14 is then patterned form a second mask encompassing all four separate levels of etch depth other than the first separate level. The thick oxide layer 12 had been previously patterned to form a penultimate encompassing only the two deepest separate levels of etch depth (in this case, separate levels 3 and 4 or, alternatively, all separate levels other than the first and second separate levels), so that thin oxide layer 13 is next photolithographically patterned to form the final mask encompassing only the deepest, or fourth, separate level of etch depth (FIGS. 7f, 7g, 7h).

A first etching of silicon wafer 10 is performed (FIG. 7i) through the first, second, penultimate, and final masks. The final mask of thin oxide layer 13, and exposed upper portions of the penultimate mask of thick oxide layer 12 which are not covered by silicon nitride layer 14 of the second mask, are removed (FIG. 7j) by a time-controlled etch.

A second etching of silicon wafer 10 is then performed (FIG. 7k) through the first and second masks and remaining portions of the penultimate mask. Thereafter, the remaining exposed lower portions of the penultimate mask not covered by silicon nitride layer 14 are removed (FIG. 7l), and a penultimate etching of silicon wafer 10 is performed (FIG. 7m) through the first mask and last remaining portions of the penultimate mask.

Next, all exposed silicon nitride portions are removed (FIG. 7n, 7o). This removes the silicon nitride layer 18 of the first mask and exposed portions of silicon nitride layer 14 of the second mask which are not covered by silicon dioxide layer 16 of the first mask. This process exposes additional regions of the penultimate mask of thick oxide layer 12. All exposed silicon dioxide portions are then removed. This removes the remaining silicon dioxide layer 16 of the first mask and the newly-exposed regions of the penultimate mask of thick oxide layer 12 which do not underlie remaining portions of the second mask of silicon nitride layer 14.

The final etching of silicon wafer 10 (FIG. 7p) is then performed through the last remaining portions of the second and penultimate masks (layers 14 and 12), after which the remaining mask/layer portions are removed (FIG. 7q).

Figure 8A:
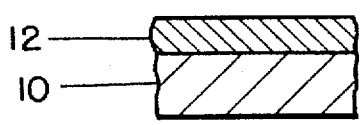
FIGS. 8a through 8u are cross-sectional views of the second embodiment of the invention which forms a silicon substrate structure having more than four separate levels of etch depth employing a thin oxide growth layer.
Figure 8B:
Figure 8C:
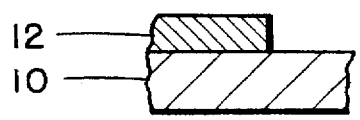
Figure 8C:
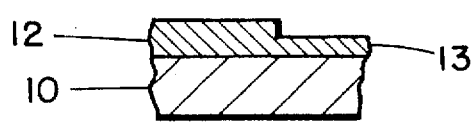
Figure 8D:
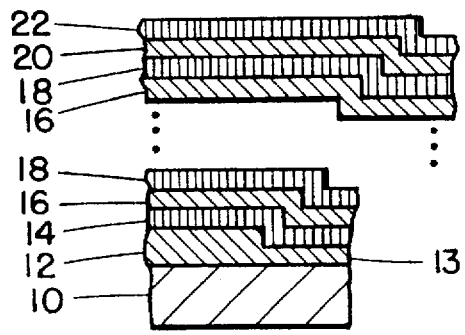
Figure 8F:
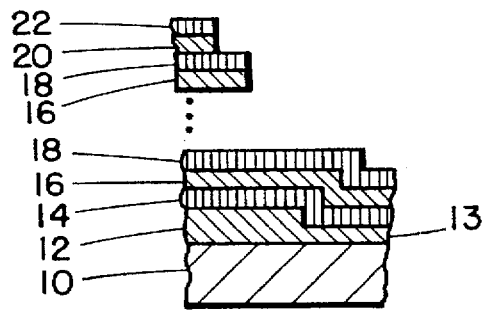
Figure 8H:
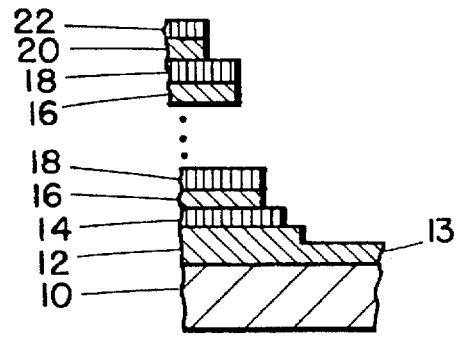

From the foregoing, it will be understood that even further separate levels of etch depth can be provided by forming a plurality of pairs of alternating layers of silicon nitride and silicon dioxide on silicon nitride layer 14. Such embodiment of the present invention is shown in FIGS. 8a through 8u, where a silicon substrate structure is formed having N separate levels of etch depth, N being an integer greater than four.

As with the previous embodiments, thick oxide layer 12 and thin oxide layer 13 are formed on silicon wafer 10 (FIGS. 8a, 8b and 8c), with silicon nitride layer 14 formed over the oxide layers. Thereafter, (N−3) pairs of alternating layers of silicon dioxide and silicon nitride are formed on silicon nitride layer 14. A total of 2×(N−3)+1 layers of masking material are thus formed on the thick oxide layer 12 and thin oxide layer 13. Those 2×(N−3)+1 layers comprise the silicon nitride layer 14, (N−4) intermediate pairs of alternating layers of silicon dioxide 16 and silicon nitride 18, and an uppermost pair of alternating layers of silicon dioxide 20 and silicon nitride 22 (FIG. 8d).

The uppermost pair of alternating layers 22, 20 are patterned (FIG. 8e) to form a first mask which encompasses the combined etching areas of all N separate levels of etch depth. The uppermost pair of the (N−4) intermediate pairs of alternating layers 18, 16 is photolithographically patterned to form a second mask (FIG. 8f) encompassing the combined etching areas of etch of all N separate levels of etch depth other than the first separate level.

After the second mask is formed, this patterning step is repeated (N−5) times for each integer K from 1 through (N−5) to successively form (N−5) additional masks. Each additional mask so formed encompasses the combined etching areas of all N separate levels of etch depth other than the etch depths from the first separate level through separate level (1+K) (FIG. 8g).

After all the intermediate pairs of silicon nitride and silicon oxide layers 18, 16 have been patterned to form the first, second, and (N−5) additional masks, silicon nitride layer 14 is photolithograpically patterned (FIG. 8h) to form a further mask which encompasses the combined etching areas of only separate levels (N−2), (N−1), and N of etch depths. Thick oxide layer 12 had previously been photolithographically patterned to encompass the combined etching areas of separate levels (N−1) and N of etch depths, so that only a final patterning (FIG. 8i) of thin oxide layer 13 to form a final mask encompassing etching areas of separate level N of etch depth is required to prepare silicon wafer 10 for etching.

Figure 8J:
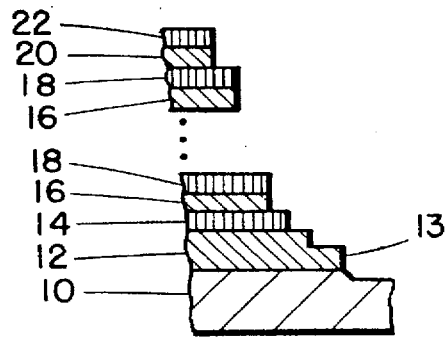
Figure 8E:
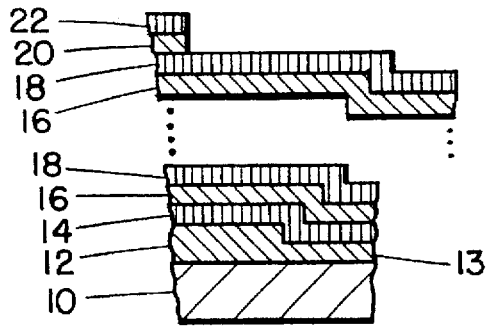
Figure 8G:
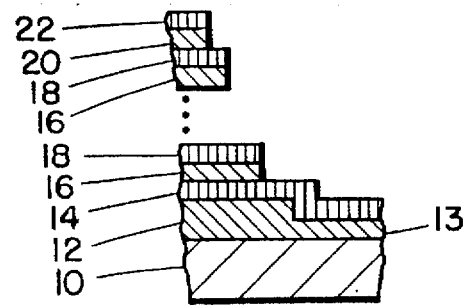
Figure 8:
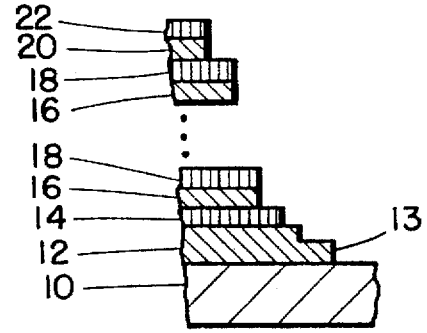
Figure 8K:
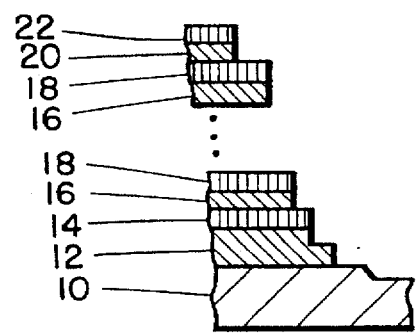

A first etching is then performed through all masks (FIG. 8j). The final mask of thin oxide layer 13 and exposed upper portions of the penultimate mask of thick oxide layer 12 which are not covered by silicon nitride layer 14 are removed (FIG. 8k), and a second etch of silicon wafer 10 is performed through the remaining masks and mask portions (FIG. 8l). The exposed lower portions of thick oxide layer 12 are then removed (FIG. 8m), and a further etching of silicon wafer 10 is accomplished through all remaining masks and mask portions (FIG. 8n).

All exposed portions of silicon nitride layers 22, 18, 14 which do not underlie a respective remaining silicon dioxide layer 20, 16 are then removed (FIG. 8o). This etching removes the silicon nitride layer 22 of the first mask, and all exposed silicon nitride portions of lower mask layers. All exposed portions of silicon dioxide layers 20, 16, 12 which do not underlie a respective remaining silicon nitride layer 18, 14 are next removed (FIG. 8p). This etching removes the remaining silicon dioxide layer 20 of the first mask and all exposed silicon dioxide portions of lower mask layers. An additional etching of silicon wafer 10 is performed through the remaining mask portions (FIG. 8q), and the nitride removal, oxide removal, and etching steps are repeated (N−5) times (FIG. 8r) until only remaining portions of the layers 18, 16 of the lowermost additional mask, the further mask of silicon nitride layer 14, and the penultimate mask of silicon dioxide layer 12 remain on the surface of silicon wafer 10.

Exposed portions of the silicon nitride layer 18 of the lowermost additional mask and the silicon nitride layer 14 of the further mask which do not underly silicon dioxide layer 16 of the lowermost additional mask are removed, followed by the removal of the exposed portions of the silicon dioxide layer 16 of the lowermost additional mask and the thick oxide layer 12 which do not underlie silicon nitride layer 14 of the further mask (FIG. 8s).

Figure 8T:
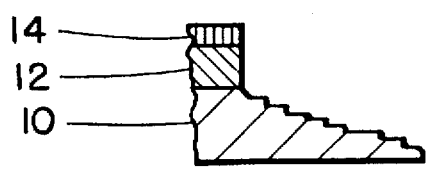
Figure 8U:
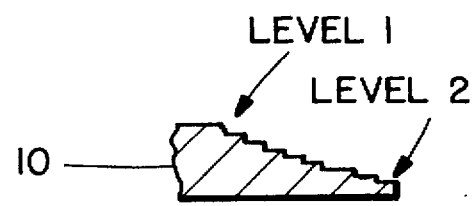

A final etching of silicon wafer 10 is then performed through the last remaining mask portions of the silicon nitride layer 14 and silicon dioxide layer 12 (FIG. 8t), after which those remaining mask portions are removed to yield the silicon substrate structure having N separate levels of etch depth (FIG. 8u).

What has been described is a fabrication process for etching a silicon structure to a plurality of different depths or levels wherein the patterning and mask formation for all the desired etch depths is carried out prior to any etching of the silicon structure. The photolithographic steps for patterning and forming the masks are therefore performed on a planar surface.

While the invention has been described in connection with a preferred embodiment, it is not intended to limit the scope of the invention to the particular form set forth, but, on the contrary, it is intended to cover such alternatives, modifications, and equivalence as may be included within the spirit and scope of the invention as defined in the appended claims.

What is claimed is:

1. A method for fabricating a silicon substrate structure having N separate levels of etch depths from a silicon substrate, N being an integer greater than one, comprising the steps of:

Step 1, forming a plurality of layers of masking material on at least one surface of said silicon substrate;

Step 2, photolithographically patterning at least one of said layers of masking material to form a first mask encompassing combined etching areas of all said N separate levels of etch depths;

Step 3, photolithographically patterning at least one other of said layers of masking material to form a final mask encompassing etching areas of only separate level N of said N separate levels of etch depths;

Step 4, performing a first etching of said silicon substrate through all of said masks;

Step 5, removing at least a portion of at least one of said masks;

Step 6, performing a final etching of said silicon substrate through remaining portions of said masks; and, Step 7, removing all remaining portions of all remaining masks.

2. The method for fabricating a silicon substrate structure according to claim 1 wherein said layers of masking material comprise alternating layers of oxide material and nitride material.

3. The method for fabricating a silicon substrate structure according to claim 2 wherein said oxide material comprises silicon dioxide.

4. The method for fabricating a silicon substrate structure according to claim 2 wherein said nitride material comprises silicon nitride.

5. The method for fabricating a silicon substrate structure according to claim 2, wherein:

N is equal to 2; step 1 forms a first layer of oxide material on said surface and a first layer of nitride material on said first layer of oxide material; step 2 photolithographically patterns said first layer of nitride material to form said first mask encompassing said first and second separate levels of etch depths; step 3 photolithographically patterns said first layer of oxide material to form said final mask encompassing said second separate level of etch depth; step 4 performs said first etching through said first and second masks; step 5 removes portions of said final mask not underlying said first mask; step 6 performs said second etching through said first mask and remaining portions of said final mask; and, step 7 removes said first mask and said remaining portions of said final mask.

6. A method of fabricating a silicon substrate structure according to claim 2, wherein:

N is equal to 3; step 1 forms four layers of said masking material on said silicon substrate, said four layers comprising a first layer of oxide material formed on said surface, a first layer of nitride material formed on said first layer of oxide material, and an upper pair of said alternating layers formed on said first layer of nitride material; step 2 photolithographically patterns said upper pair of alternating layers to form said first mask; step 2 is followed by a further step of photolithographically patterning said first layer of nitride material to form a second mask encompassing combined etching areas of said second and third separate levels of etch depth; step 3 photolithographically patterns said first layer of oxide material to form said final mask encompassing etching areas of said third separate level of etch depth; step 4 performs said first etching through said first, second, and final masks; step 5 removes exposed portions of said final mask not underlying said second mask; step 5 is followed by the steps of performing a second etching of said silicon substrate through said first and second masks and remaining portions of said final mask, removing said layer of nitride material of said first mask and exposed portions of said second mask not underlying said layer of oxide material of said first mask, and removing said layer of oxide material of said first mask and exposed portions of said final mask not underlying remaining portions of said second mask; step 6 performs said final etching through last remaining portions of said second and final masks; and, step 7 removes said last remaining portions of said second mask and said final mask.

7. A method for fabricating a silicon substrate structure according to claim 2, wherein:

N is greater than 3; step 1 forms 2×(N−1) layers of said masking material on said silicon substrate, said 2 ×(N−1) layers comprising a first layer of oxide material formed on said surface, a first layer of nitride material formed on said first layer of oxide material, (N−3) intermediate pairs of alternating layers of masking material formed on said first layer of nitride material, and an uppermost pair of alternating layers of masking material formed on said intermediate pairs on alternating layers of masking material; step 2 photolithographically patterns said upper-most pair of alternating layers to form said first mask; step 2 is followed by a Step 2A of photolithographically patterning an upper pair of said (N−3) intermediate pairs of alternating layers to form a second mask, said second mask encompassing combined etching areas of all said N separate levels of etch depths other than said first separate level of etch depth; and step 2A is repeated (N−4) times for each integer K, K=1, 2, . . . , (N−4) to photolithographically pattern successive pairs of said (N−3) intermediate pairs of alternating layers underlying each previously patterned pair of said (N−3) intermediate pairs of alternating layers to form (N−4) additional masks, each said additional mask encompassing combined etching areas of all said N separate levels of etch depths other than separate levels of etch depth from said first separate level of etch depth through said separate level (1+K) of etch depth; and step 2A is followed by a step 2B of photolithographically patterning said first layer of nitride material to form a penultimate mask encompassing combined etching areas of said separate level (N–1) and said separate level N of etch depth; step 3 photolithographically patterns said first layer of oxide material to form said final mask encompassing etching areas of said separate level N of etch depth; step 4 performs said first etching through all said masks formed in Steps 2, 2A, each said repetition of Step 2A, said penultimate mask, and said final mask; step 5 removes first portions of said final mask not underlying said penultimate mask; step 5 is followed by the steps of

Step 5A, performing a said second etching of said silicon substrate through said masks formed in Step 2, Step 2A, each said repetition of Step 2A, said penultimate mask, and first remaining portions of said final mask, Step 5B, removing exposed portions of each remaining layer of nitride material not underlying a respective remaining layer of oxide material, Step 5C, removing portions of each said respective remaining layer of oxide material not underlying a respective remaining layer of nitride material, Step 5D, performing a next etching of said silicon substrate through all said remaining layers of oxide material and nitride material, and Step 5E, repeating Steps 5B, 5C, and 5D in sequence (N–4) times, whereby a penultimate etching of said silicon substrate is performed through remaining portions of a lowermost additional mask, said penultimate mask, and said final mask, and Step 5F, repeating Steps 5B and 5C in sequence; step 6 performs said final etching of said silicon substrate through last remaining portions of said penultimate mask and said final mask; and step 7 removes said last remaining portions of said penultimate mask and said final mask.

8. A method for fabricating a silicon substrate structure having N separate levels of etch depth from a silicon substrate, N being an integer greater then one, comprising the steps of:

Step 1, forming a thick layer of masking material on a surface of said silicon substrate;

Step 2, photolithographically patterning said thick layer of masking material to form a penultimate mask encompassing combined etching areas of said separate level N of etch depth and said separate level (N–1) of etch depth;

Step 3, forming a thin layer of masking material on portions of said surface of said silicon substrate not underlying said penultimate mask;

Step 4, photolithographically patterning said thin layer of masking material to form a final mask encompassing etching areas of said separate level N of etch depth;

Step 5, performing a first etching of said silicon substrate through all said masks;

Step 6, removing said final mask and upper portions of said penultimate mask;

Step 7, performing a final etching of said silicon substrate through last remaining portions of each remaining mask; and, Step 8, removing said last remaining portions of each said remaining mask.

9. The method for fabricating a silicon substrate structure according to claim 8, wherein:

said thick layer of masking material is a thick layer of oxide material; and, said thin layer of masking material is a thin layer of oxide material.

10. The method for fabricating a silicon substrate structure according to claim 9, wherein said oxide material is silicon dioxide.

11. The method for fabricating a silicon substrate structure according to claim 9 wherein N is equal to 2.

12. The method for fabricating a silicon substrate structure according to claim 9, wherein:

N is equal to 3; step 3 is followed by the steps of forming an additional layer of masking material on said penultimate mask and said thin layer of oxide material, and photolithographically patterning said additional layer of masking material to form a first mask encompassing combined etching areas of all said 3 separate levels of etch depths; step 4 forms said final mask compassing said etching areas of said third separate level of etch depth; step 5 performs said first etching through said first, penultimate, and final masks; step 6 removes said final mask and exposed upper portions of said penultimate mask not underlying said first mask; step 6 is followed by the steps of performing a penultimate etching of said silicon substrate through said first mask and first remaining portions of said penultimate mask, and removing exposed lower portions of said penultimate mask not underlying said first mask; step 7 performs said final etching through said first mask and last remaining portions of said penultimate mask; and, step 8 removes said first mask and said last remaining portions of said penultimate mask.

13. The method for fabricating a silicon substrate structure according to claim 12, wherein said additional layer of masking material is a layer of nitride material.

14. The method for fabricating a silicon substrate structure according to claim 13, wherein said nitride material is silicon nitride.

15. The method for fabricating a silicon substrate structure according to claim 9, wherein:

N is equal to 4; step 3 is followed by the steps of forming three additional layers of masking material on said penultimate mask and said thin layer of oxide material, said additional layers comprising a first layer of nitride material formed on said penultimate mask and said thin layer of oxide material, and an upper pair of alternating layers of oxide material and nitride material formed on said first layer of nitride material, said layer of oxide material of said upper pair of alternating layers being formed on said first layer of nitride material, photolithographically patterning said upper pair of alternating layers to form a first mask encompassing combined etching areas of all said 4 separate levels of etch depth, and photolithographically patterning said first layer of nitride material to form a second mask encompassing combined etching areas of said second, third, and fourth separate levels of etch depth; step 4 forms said final mask encompassing said etching areas of said fourth separate level of etch depth; step 5 performs said first etching through said first, second, penultimate, and final masks; step 6 removes said final mask and exposed upper portions of said penultimate mask not underlying said second mask; step 6 is followed by the steps of performing a second etching of said silicon substrate through said first and second masks and first remaining portions of said penultimate mask, removing exposed lower portions of said penultimate mask not underlying said second mask, performing a penultimate etching of said silicon substrate through said first and second masks and second remaining portions of said penultimate mask, removing said layer of nitride material of said first mask and exposed portions of said second mask not underlying said layer of oxide material of said first mask, and removing said layer of oxide material of said first mask and exposed portions of said penultimate mask not underlying remaining portions of said second mask; step 7 performs said final etch through last remaining portions of said second mask and said penultimate masks; and step 8 removes said last remaining portions of said second and penultimate masks.

16. The method for fabricating a silicon substrate structure according to claim 15, wherein said nitride material comprises silicon nitride.

17. The method for fabricating a silicon substrate structure according to claim 9, wherein:

N is greater than four; step 3 is followed by the steps of

Step 3a, forming 2×(N−3)+1 additional layers of masking material on said penultimate mask and said thin layer of oxide material, said additional layers comprising a first layer of nitride material formed on said penultimate mask and said thin layer of oxide material, (N−4) intermediate pairs of alternating layers of oxide material and nitride material, said layer of oxide material of a lowermost pair of alternating layers being formed on said first layer of nitride material, and an uppermost pair of alternating layers of oxide material and nitride material formed on said (N−4) intermediate pairs of alternating layers, said layer of oxide material of said uppermost pair of alternating layers being formed on said upper layer of nitride material of said (N−4) intermediate pairs of alternating layers, Step 3b, photolithographically patterning said uppermost pair of alternating layers to form a first mask encompassing combined etching areas of all said N separate levels of etch depths, Step 3c, photolithographically patterning an upper pair of said (N−4) intermediate pairs of alternating layers to form a second mask encompassing combined etching areas of all said N separate levels of etch depths other than said first separate level of etch depth, Step 3d, repeating Step 3c (N−5) times for each integer K, K=1, 2, . . . , (N−5) to photolithographically pattern successive pairs of said intermediate pairs of alternating layers underlying each previously patterned pair of alternating layers to form (N−5) additional masks, each said additional mask encompassing combined etching areas of all said N separate levels of etch depth other than separate levels of etch depth from said first separate level of etch depth through said separate level (1+K) of each depth;

Step 3e, photolithographically patterning said first layer of nitride material to form a further mask encompassing combined etching areas of said separate levels (N−2), (N−1), and N of said N separate levels of etch depths; step 6 removes said final mask and exposed upper portions of said penultimate mask not underlying said further mask; step 6 is followed by the steps of

Step 6a, performing a second etching of said silicon substrate through all remaining mask portions, Step 6b, removing exposed portions of said penultimate mask not underlying said further mask, Step 6c, performing a further etching of said silicon substrate through all remaining mask portions, Step 6d, removing all exposed portions of all said layers of nitride material which do not underlie a respective remaining layer of oxide material, Step 6e, removing all exposed portions of all said layers of oxide material which do not underlie a respective remaining layer of nitride material, Step 6f, performing a next etching of said silicon substrate through all remaining mask portions, Step 6g, repeating Steps 6d, 6e, and 6f (N−5) times;

Step 6h, repeating Steps 6d and 6e; step 7 performs said final etching through last remaining portions of said further mask and said penultimate mask; and, step 8 removes said last remaining portions of said further mask and said penultimate mask.

18. The method for fabricating a silicon substrate structure according to claim 17, wherein said nitride material is silicon nitride.

* * * * *